(12) United States Patent
Ken

(10) Patent No.: US 9,312,254 B2
(45) Date of Patent: Apr. 12, 2016

(54) SEMICONDUCTOR MULTI-PROJECT OR MULTI-PRODUCT WAFER PROCESS

(71) Applicant: Weng-Dah Ken, Hsinchu (TW)

(72) Inventor: Weng-Dah Ken, Hsinchu (TW)

(73) Assignee: Weng-Dah Ken, Hsinchu (TW)

(*) Notice: Subject to any disclaimer, the term of this patent is extended or adjusted under 35 U.S.C. 154(b) by 0 days.

(21) Appl. No.: 14/824,095

(22) Filed: Aug. 12, 2015

(65) Prior Publication Data
US 2016/0043065 A1   Feb. 11, 2016

Related U.S. Application Data

(63) Continuation of application No. 13/228,237, filed on Sep. 8, 2011, now Pat. No. 9,140,978.

(60) Provisional application No. 61/392,169, filed on Oct. 12, 2010.

(51) Int. Cl.
| | | |
|---|---|---|
| H01L 21/00 | (2006.01) | |
| H01L 25/00 | (2006.01) | |
| H01L 21/78 | (2006.01) | |
| H01L 21/768 | (2006.01) | |
| H01L 21/263 | (2006.01) | |
| H01L 21/283 | (2006.01) | |
| H01L 23/00 | (2006.01) | |
| H01L 23/544 | (2006.01) | |
| H01L 21/304 | (2006.01) | |
| H01L 21/66 | (2006.01) | |

(52) U.S. Cl.
CPC ............. *H01L 25/50* (2013.01); *H01L 21/263* (2013.01); *H01L 21/283* (2013.01); *H01L 21/304* (2013.01); *H01L 21/76802* (2013.01); *H01L 21/78* (2013.01); *H01L 22/26* (2013.01); *H01L 22/32* (2013.01); *H01L 23/544* (2013.01); *H01L 24/81* (2013.01); *H01L 24/85* (2013.01); *H01L 24/89* (2013.01); *H01L 2223/5446* (2013.01); *H01L 2224/16146* (2013.01); *H01L 2224/48145* (2013.01); *H01L 2224/94* (2013.01); *H01L 2225/06506* (2013.01); *H01L 2225/06513* (2013.01); *H01L 2225/06541* (2013.01); *H01L2924/13091* (2013.01); *H01L 2924/3701* (2013.01); *H01L 2924/37001* (2013.01)

(58) Field of Classification Search
CPC ....................................................... H01L 24/11
See application file for complete search history.

(56) References Cited

U.S. PATENT DOCUMENTS

| | | | |
|---|---|---|---|
| 8,129,288 | B2 | 3/2012 | Shanker |
| 2008/0296571 | A1 | 12/2008 | Cheng |
| 2009/0227049 | A1 | 9/2009 | Chiang |
| 2010/0068832 | A1 | 3/2010 | Shih |

FOREIGN PATENT DOCUMENTS

| | | |
|---|---|---|
| TW | 200410080 | 6/2004 |
| TW | 200523673 | 7/2005 |
| TW | 200627224 | 8/2006 |
| TW | 200736844 | 10/2007 |
| TW | 201250921 | 12/2012 |

OTHER PUBLICATIONS

"Multi-Project Wafer (MPW) Introduction and Development Perspective"Ci-Fong Jiang, Integrated Circuits Application, abstract, p. 13-15, vol. 2, Apr. 2001.

*Primary Examiner* — Angel Roman
(74) *Attorney, Agent, or Firm* — Winston Hsu; Scott Margo

(57) ABSTRACT

The embodiment provides a semiconductor MP wafer process including processing a plurality of MP wafers in a lot or batch with a first process step. The plurality of the MP wafers is split into an MP wafer group-1 and an MP wafer group-2. At least one of the MP wafers of the MP wafer group-1 is processed with a second process step-1 and at least one of the MP wafers of the MP wafer group-2 is processed with a second process step-2 to form different device components on the MP wafers of the MP wafer group-1 and group-2, respectively. At least one of the MP wafers of the MP wafer group-1 is processed with a third process step-3 and at least one of the MP wafers of the MP wafer group-2 is processed with a third process step-4 to form a substantially same characteristic device component on the MP wafers.

22 Claims, 8 Drawing Sheets

SEMICONDUCTOR MULTI-PROJECT OR MULTI-PRODUCT WAFER PROCESS

CROSS REFERENCE TO RELATED APPLICATIONS

This is a continuation application of U.S. patent application Ser. No. 13/228,237, filed on Sep. 8, 2011, which claims the benefit of U.S. Provisional Application No. 61/392,169 filed on Oct. 12, 2010. The above mentioned applications are included in their entirety herein by reference.

BACKGROUND OF THE INVENTION

1. Field of the Invention

The present invention relates to a semiconductor multi-project or multi-product (MP) wafer process, and in particular, to a semiconductor MP wafer process with lower non-recurring engineering (NRE) prototyping or production manufacturing costs, a shorter cycle-time and more flexible semiconductor manufacturing or IC product mass production service.

2. Description of the Prior Art

As semiconductor technology scaling down and increasing in complexity, the NRE of new mask sets and wafers required to fabricate devices has been increasing significantly in complexity, number, and overall cost. For those fabless IC companies, the financial barrier of semiconductor IP/Lib design, IC prototyping or even small volume production becomes prohibitively higher for coming nano-meter (nm) scale technologies. One solution of easing the NRE costs offered by semiconductor foundry suppliers is to provide a multi-project wafer with a mask-shuttle. Using a mask-shuttle multi-project wafer service, the foundry provider can share the initial NRE cost over multiple fabless customers, depending on number of shuttle seats required for their IC design prototyping purposes.

Having mask-shuttle services, IC designs or IP/Lib (macro) function unit are submitted for semiconductor design verification using either open (i.e., non-proprietary) or vendor proprietary IP/Library. IC designs are pooled into a common mask set and in a prototyping wafer lot. Then, semiconductor wafers run through the fabrication process at semiconductor foundry. The finished semiconductor chips (packaged or unpackaged) are returned to those foundry customers or users who submitted their IC designs or IP/Lib (macro) functional units for making the multi-project wafer.

The semiconductor IC industry has experienced rapid growth for decades. Technological advances in IC materials, process and design have produced generations of ICs where each generation has smaller and more complex circuits than the previous generation. However, these advances have increased the complexity of processing and fabricating ICs. Furthermore, while the IC industry has been getting matured, the various operations needed to produce an IC may be performed at different locations by a single company or by different companies that specialize in a particular area. For example, IC foundry fabricating processes that use a mask shuttle can create multi-project wafers for a single or multiple customers.

FIG. 8 illustrates a conventional multi-project wafer mask set incorporated with multiple process nodes. The mask set 800 includes a first layer mask 802, a second layer mask 804, a third layer mask 806, a fifth layer mask 812, a sixth layer mask 814, and an eighth layer mask 820 that are multiple technology node mask (MTM). The mask set 800 further includes a fourth layer mask 808 and 810, a seventh layer mask 816 and 818. The masks 802, 804, 806, 812, 814 and 820 are single technology node mask (STM). The mask set MTMs (808, 816) and (810, 812) each include a first and second pattern associated with a different technology node respectively (for instance, 65 nm and 90 nm technology nodes). The fourth layer mask 808 and the seventh layer mask 816 are STMs and include the first pattern (e.g. 65 nm technology node) and the fourth layer mask 810 and the seventh layer mask 818 are STMs and include the second pattern (e.g. 90 nm technology node). The mask set 800 is used to fabricate a device including the first pattern, and a device including the second pattern.

SUMMARY OF THE INVENTION

The conventional mask shuttle design generally involves communications between only for foundry's customers and its semiconductor fabricating facilities. More than that, in a MP wafer or its derived finished parts transaction of coming future, there is an increasing needs for a single or multiple clients, e.g. customers or users, who may dynamically request that a particular layer of mask can be split, or a given process recipe can be split with different priorities or different recipe functions or contents such that it can be meeting with different tailor-made requirements of semiconductor device components, i.e. device structures or physical/electrical characteristics. In a more flexible and novel way, the new method or service of this invention can shorten prototyping design verification/characterization cycle time and speed up the time to market for their future IC products. Thus, a novel semiconductor multi-project or -product (MP) wafer process method, with a lower prototyping NRE, a lower production cost or a shorter cycle-time for manufacturing those multiple IC designs or products at the same time, is desired. A semiconductor MP wafer manufacturing method is provided. An exemplary embodiment of a semiconductor MP wafer process comprises processing a plurality of MP wafers in a lot or batch with a first process step. The plurality of MP wafers in a lot or batch is split into an MP wafer group-1 and an MP wafer group-2 after the first process step is completed. At least, one of the MP wafers of the MP wafer group-1 is processed with a second process step-1 (step-A) and at least one of the MP wafers of the MP wafer group-2 is processed with a second process step-2 (step-B). Wherein, the second process step-1 (step-A) and the second process step-2 (step-B) may form different device components, i.e. semiconductor device structures or physical/electrical characteristics respectively on the MP wafers of the MP wafer group-1 and on the MP wafers of the MP wafer group-2. Also, the second process step-1 and the second process step-2 both can be corresponding to a substantially same technology generation. Then, the at least one of the MP wafers of the MP wafer group-1 is processed with a third process step-3 (step-C) and the at least one of the MP wafers of the MP wafer group-2 is processed with a third process step-4 (step-D) respectively after the second process step-1 (step-A) and the second process step-2 (step-B) are completed. Commonly, the third process step-3 (step-C) and the third process step-4 (step-D) are functionally the same process steps performed by the substantially same process recipe, the same model process tool or the same type of process tools, such as a same type of etching or lithography tools coming from a same or different tool suppliers. That functionally same process steps shall form substantially the same characteristic semiconductor device components, i.e. similar device structures, physical/electrical characteristics, and the like, on the MP wafers of the MP wafer group-1 and the MP wafers of the MP wafer group-2 respectively. Then, the plurality of MP wafers, including the at least one MP wafer of MP wafer group-1 or group-2, is processed with a subsequent process to fabricate a plurality of finished MP wafers. It is a common knowledge for skilled persons in the art, there could be another process step-X, such as film deposition or cleaning step, presenting before or after the second process step-1 (step-A) for the MP wafer group-1. And the like, there could be another process step-Y, such as film deposition or cleaning step, presenting before or after the second process step-2 (step-B) for the MP wafer group-2, wherein the process step-X and step-Y can be the different, or can be substantially the same ones. Also, after the completion of the second process step-1 (step-A) and the second process step-2 (step-B), the at least one MP wafer of MP wafer of group-1 and the at least one MP wafer of group-2 can be processed together at the same tool with same recipe or different tools with a substantially same recipe and tool function, such as different etching tools with the same model or function associated with the same or different tool suppliers. Or, for the better manufacture scheduling and delivery flexibility, the at least one MP wafer of MP wafer group-2 can be processed at the different date/time other than that of the at least one MP wafer of MP wafer group-1, even though the subsequent process of MP wafer group-2 is with functionally the same step as the subsequent process of MP wafer group-1 to fabricate the finished MP wafers.

Another exemplary embodiment of a semiconductor MP wafer process comprises processing an MP wafer with a photolithography process using a mask. Then, the MP wafer is processed with a first process comprising an etching, a deposition or an ion-implantation process after the photolithography process is completed. The MP wafer is processed with an ion-beam maskless lithography process either before or after the first process is completed. The MP wafer is processed with a second process comprising an etching, a deposition or an ion-implantation process after the ion-beam maskless lithography process is completed, thereby forming a semiconductor device component, structure or characteristics associated with the maskless lithography process on the MP wafer. Then, the MP wafer is processed with a subsequent process to fabricate a finished MP wafer.

Another exemplary embodiment of a high yield semiconductor wafer dicing, scribe and chip separation process comprises forming a plurality of IC designs with different chip sizes on a semiconductor wafer, wherein the plurality of IC designs respectively containing a lithography patterning information, metal interconnection pattern, chip dimension or inter-layer via hole pattern are different; processing a first wafer scribe process comprising Laser on the wafer, wherein the Laser process removes an enough portion of surface materials or layer(s) on the scribe line area of the wafer either on its backside or front side; and applying a subsequent process to the wafer, wherein the subsequent process at least comprises a die picking up process, and the die picking up process is used for separating individual dies of the plurality of IC designs out of the diced wafer.

For coming maskless nm technology era, aforementioned MP wafer process method creates the maskless MP wafer service which is the more flexible and versatile service method for foundry or integrated device manufacturer (IDM) companies to manufacturing various IC devices for meeting dynamic combinations of customer's Si-IP/Lib designs, prototyping, characterization or final production demands associated with their single or multiple clients, e.g. customers or users. However, the maskless tool running cost of a MP wafer lot can be easily amortized over different foundry or IDM clients, e.g. customers or users, who share the same run of MP wafer services. Or, it can be running as many as needed by a single or a set of clients, e.g. customers or users, for a given semiconductor technology generation. Nowadays, fabless or IDM clients, e.g. customers or users, experience the increasing needs for a shorter cycle time and cost effective MP wafer or finished parts service method and apparatus that may overcome the aforementioned requirements of IC prototyping, Si-IP/Lib (Macro) functional characterization, verification development or manufacturing. There is indeed the significant economic advantage of making different prototyping or even mass production IC devices via the same lot of semiconductor MP wafers for multiple clients. In addition, that MP wafer service shall dramatically reduce NRE cost of overall mass production charges. It, in turn, enables the semiconductor industry achieving the faster, lower-cost, better quality prototyping with higher confidence level. In addition, this invention can be enabling different IC design or product options, broadening the manufacturability with better process control or enhancing higher rate of one-time success for manufacturing production products associated with all kinds of clients, e.g. customers or users, of foundry or IDM companies.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
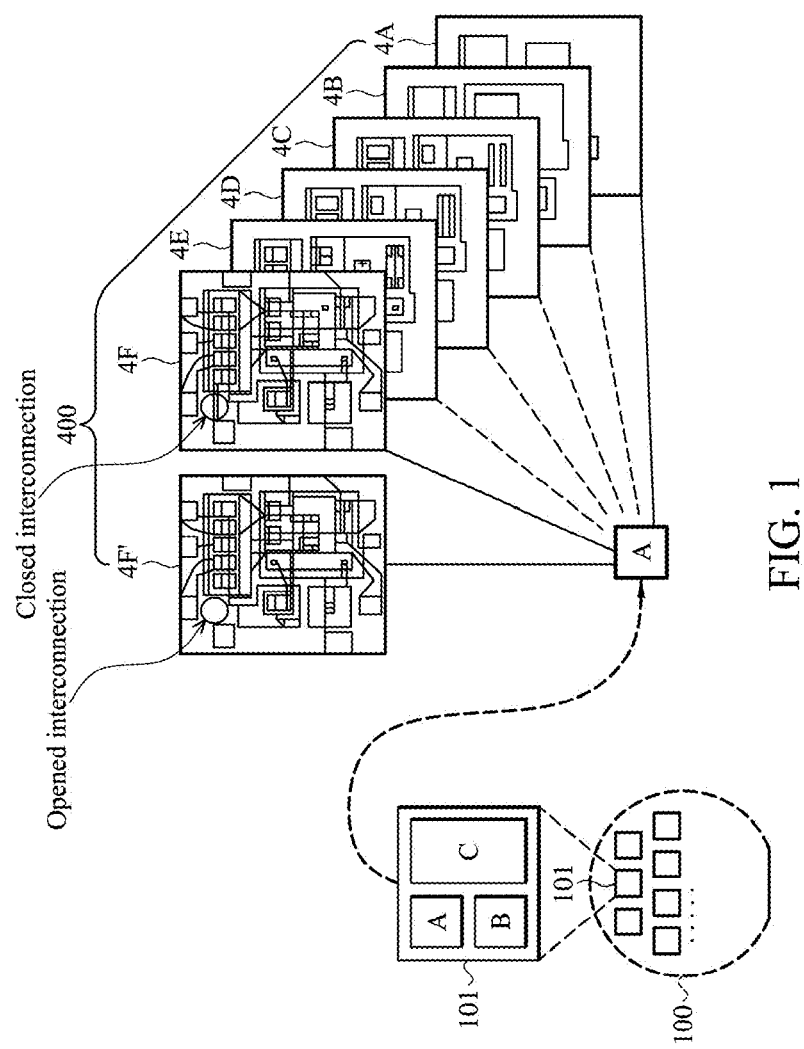
FIG. 1 illustrates a portion design, layout or patterning information (400) of the MP mask set for one embodiment of a semiconductor MP wafer process and an IC chip (400) fabricated by the one embodiment of the semiconductor MP wafer process of the invention.

The following description is an example of a mode for carrying out the invention. This description is made for the purpose of illustrating the general principles of the invention and should not be taken in a limiting sense. The scope of the invention is best determined by reference to the appended claims. Wherever possible, the same reference numbers are used in the drawings and the descriptions to refer the same or like parts.

The present invention will be described with respect to particular embodiments and with reference to certain drawings, but the invention is not limited thereto and is only limited by the claims. The drawings described are only schematic and are non-limiting. In the drawings, the size of some of the elements may be exaggerated and not drawn to scale for illustrative purposes. The dimensions and the relative dimensions do not correspond to actual dimensions to practice the invention.

The present invention relates to MP wafer or finished parts prototyping development service or manufacturing. In particularly, it relates to a fabrication method and apparatus for nano-technology MP wafer or finished parts manufacturing services for those semiconductor wafer foundry or integrated device manufacturer (IDM) companies. The innovative mechanism shall raise performance/cost ratios, thereby reducing overall non-recurring engineering (NRE) costs or shorten overall prototyping verification and characterization cycle times thereof. Accordingly, significant commercial value or research benefit is provided to those clients, e.g. customers or users, of semiconductor wafer foundry or IDM companies due to the innovative mechanism of this invention, such as, a speedier time-to-market for products with a lower manufacturing cost and production ramping up cycle time and the like.

FIG. 1 illustrates a MP mask set 400 for one embodiment of a semiconductor MP wafer process and an IC chip fabricated by the one embodiment of the semiconductor MP wafer process. As shown in FIG. 1, a MP wafer 100 fabricated by the one embodiment of the semiconductor MP wafer process has a plurality of MP chips 101. Each of the MP chips 101 has associated with various IC designs or Si-IP/Si-Lib unit representations (such as IC design A, IC design B and IC design C). As shown in FIG. 1, the IC design A associated with the MP chips 101 is fabricated by one embodiment of the semiconductor MP wafer process using a MP mask set 400. In one embodiment, the MP mask set 400 comprises a plurality of masks 4A, 4B, 4C, 4D, 4E, 4F or 4F' for formations of various device components at different levels. Additionally, the MP mask set 400 has at least one mask split, which comprises at least two different masks (such as the masks 4F and 4F') associated with the same masking level for fabricating critical device components, for example, a source/drain active area, an interconnection or an via hole (i.e. a through hole connecting two conductive layers either with substantially same materials or with different materials), on a same masking level for different MP wafers in the same wafer lot. In one embodiment, differences between the masks 4F and 4F' may comprise a device functional application, a chip size, design information, a layout information, an exposure pattern information, a critical dimension or the like, which correspond either to a single or respective MP wafer clients. Therefore, the IC products may be fabricated completely with various functions on the different or even the same MP wafers 100 in one wafer process run/lot or batch by the one embodiment of the semiconductor MP wafer process using the MP mask set 400. A skill in the art knows, a conventional mechanical diamond particle coated disc-saw dicing method cannot dice out individual chips easily or effectively for a semiconductor wafer including plurality or various size(s) (i.e. their x or y physical dimensions are different) of IC chips. To overcome the limits, after fabricating the finished MP wafer including multiple chips with different chip size, such as IC design A, IC design B and IC design C, etc. associated with the MP chip 101, it can be dicing out of the MP wafer 100 or any semiconductor wafer including plurality sizes of IC chips by a improved scribe-line dicing method, wherein the dicing method includes of Laser so as to form a better and high yield IC chip dicing, scribe or break out process for such semiconductor wafers. As an exemplary case, the finished MP wafer 100 can be firstly treated by the Laser scribe process for removing an enough portion of surface materials or certain surface layer(s) on the scribe line area of the finished MP wafer 100, either from its backside or front side surface(s). Then, a subsequent wafer dicing steps will be applied to the finished MP wafer 100, including a mechanical disc-saw scribing or a back-grind process, such as a CMP (Chemical Mechanical Polish) process, can remove enough the scribe line front surface materials or can remove backside Semiconductor wafer thickness or layer(s) of the finished MP wafer. Then, each chips of IC design A, IC design B and IC design C can be dicing or broken out of the finished and diced MP wafer 100 individually by a following blue-tape expansion process step or more following up processes such as die picking up process. Another exemplary case, a major portion (or thickness) of the Semiconductor wafer material or layer(s) on the backside of the finished MP wafer 100 can be removed firstly by a back-grind or a CMP process. Following that, a subsequent scribe (dicing) process comprising Laser or mechanical disc-saw process will be applied, wherein the process is able to cut (scribe) through or to partially remove portion of the surface materials or surface layer(s) on the scribe line of the finished MP wafer 100. After that, the finished MP wafer 100 including plurality of MP chip 101 associated with IC design A, IC design B and IC design C can receive another dicing or other chip separation (singulation) process steps to dice or break those chips individually out of the finished and diced MP wafer 100 into piece-by-piece chips including IC design A, IC design B and IC design C, as an exemplary, by using a following blue-tape expansion process step or more following processes such as die picking up process. Thus, the mass production cost, the number of mask sets for IC mass production, IC design/process window verifications or process/product characterizations cycle time for each of the IC chips or the Si-IP/Si-Lib (macro) unit prototyping or mass production cases can be reduced. So, the design verification cycle time and multiple client's IC mass production time-to-market cycle time can be shortened effectively.

Figure 2:
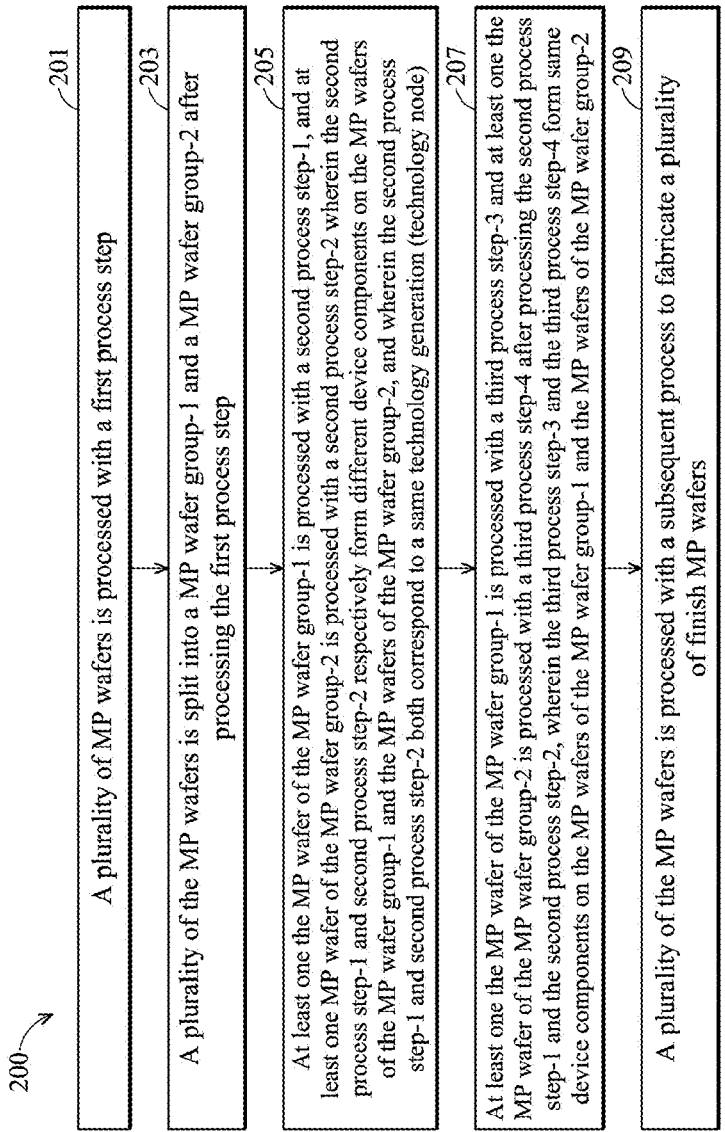
FIG. 2 illustrates a flow chart of the one embodiment of the semiconductor MP wafer lot or batch process of the invention.
Figure 3A:
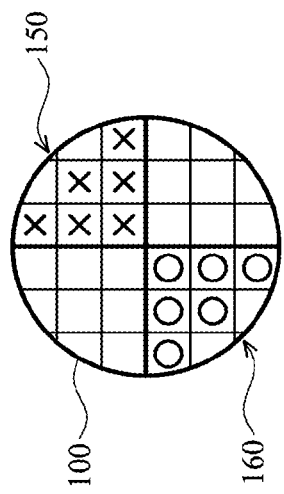
FIGS. 3A to 3D illustrate semiconductor MP wafers having various wafer zones fabricated by another embodiment of a semiconductor MP wafer process of the invention.
Figure 3B:
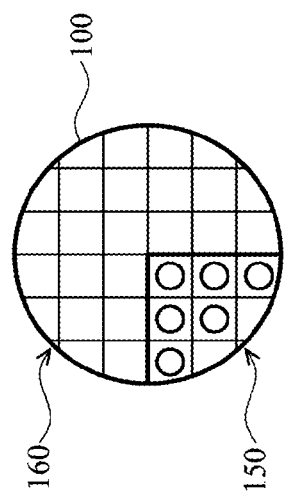
Figure 3C:
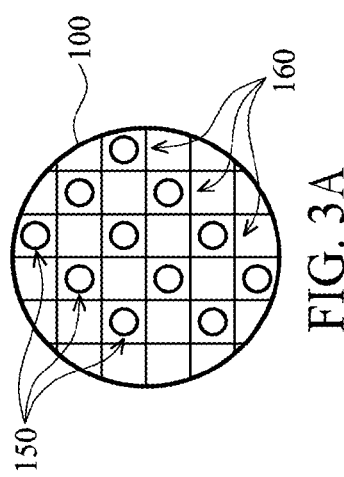
Figure 3D:
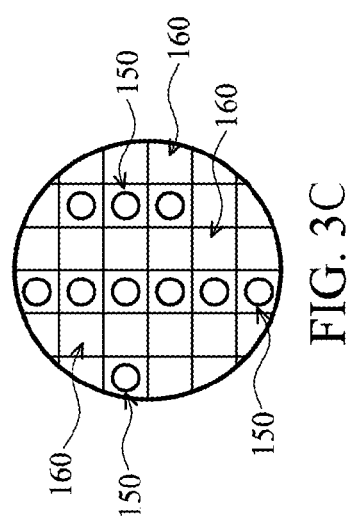

FIG. 2 illustrates a flow chart of one embodiment of a semiconductor MP wafer process 200 utilizing the MP mask set 400 of the invention. Firstly, a plurality of MP wafers in a same wafer lot or batch is processed with a first process step (step 201). In one embodiment, the first process step or flow comprises a lithography exposure process, an ion implantation process, a cleaning process or an etching process. The MP wafers (FIG. 2, step 201) may share the same first process flows, tools or steps, but run through the substantially same or different fabrication tools (equipments), wherein corresponding to a single or set of first process flows or steps associated with substantially the same process function or content (i.e. condition or recipe).

Next, a plurality of the MP wafers in the same wafer lot is split into an MP wafer group-1 and an MP wafer group-2 after the first process step is completed (step 203). This method saves time and reduced mass production effective costs for process window optimization, IC design window verification and/or characterization.

Next, at least one of the MP wafers of the MP wafer group-1 is processed with a second process step-1, and at least one of the MP wafers of the MP wafer group-2 is processed with a second process step-2, wherein the second process step-1 and the second process step-2, respectively, form different device components on the MP wafers of the MP wafer group-1 and the MP wafers of the MP wafer group-2, and wherein the second process step-1 and the second process step-2, both correspond to a substantially same technology generation (technology node) (step 205). In one embodiment, the second process step-1 and the second process step-2 comprise a lithography exposure process, an ion implantation process, a cleaning process or an etching process or the like. The MP wafer group-1 and group-2 may run through the substantially same or different fabrication tools (equipments) corresponding to a process flow or step, such as "interconnect formation", associated with different process function or contents (conditions or recipes). In this embodiment, the second process step-1 comprises a lithography exposure process with a first mask, such as the mask 4F, as shown in FIG. 1 and the second process step-2 comprises a lithography exposure process with a second mask, such as the mask 4F', as shown in FIG. 1. In the embodiment, differences between the masks 4F and 4F' may comprise IC layout information, a device functional application, a chip size, design information, a layout information, an exposure pattern information, a critical dimension or the like, wherein the IC layout or design information of the masks 4F and 4F' are both associated with a single MP wafer or its finished parts client. Alternatively, the primary functional applications and the chip sizes of the masks 4F and 4F' are substantially the same, and the detailed design information, the exposure patterns or the critical dimensions of the masks 4F and 4F' are different. For example, the first 4F and the second 4F' masks may have different IC design or layout information comprising an active area layout pattern, a source/drain layout pattern, an interconnection layout pattern or an via hole layout pattern. In this embodiment as shown in FIG. 1, the different masks 4F and 4F' correspond to different interconnections which correspond to the respective MP wafer group-1 and MP wafer group-2. Alternatively, if the second process step-1 and the second process step-2 are ion implantation processes, wherein their recipes or conditions (comprising ion implantation energy, tilting or dosage recipes or conditions) for the second process step-1 and the second process step-2 may be different from that of each other. Alternatively, if the second process step-1 and the second process step-2 are etching processes, for example, the semiconductor device (MOSFET) gate formation or etching processes. Their recipes or conditions of the etching processes (gate critical dimensions or gate cross-section profiles) for the second process step-1 and the second process step-2 may be different from that of each other. Therefore, as the exemplary cases, the semiconductor device components fabricated by the second process step-1 and the second process step-2 may associate with a semiconductor device source/drain, an interconnection or a via hole.

Next, at least one of the MP wafers of the MP wafer group-1 is processed with a third process step-3 and at least one of the MP wafers of the MP wafer group-2 is processed with a third process step-4 after the second process step-1 and step-2 is completed respectively, wherein the third process step-3 and the third process step-4 form the substantially same device characteristic components on the MP wafers of the MP wafer group-1 and the MP wafers of the MP wafer group-2 (step 207). In one embodiment, the third process step-3 and the third process step-4 comprising a lithography exposure process, an ion implantation process, a cleaning process or an etching process, wherein they may share the same process flow, tools or steps, but run through either the substantially same or different fabrication tools (equipments) corresponding to a single or set of process flow or steps which are associated with substantially the same process function or content (condition or recipe).

Next, a plurality of the MP wafers is processed with a subsequent process to fabricate a plurality of finished MP wafers or finished parts (step 209). Finally, the finished MP wafers or finished parts are delivered to respective MP wafer or finished parts clients. In another embodiment, the semiconductor MP wafer process 200 may further comprise website linking to an internet online request or acknowledgment coming from an MP wafer or finished parts client(s) for fabricating the MP wafer group-1 and the MP wafer group-2 with different processes. In addition, it can further comprise a service or process linking for MP wafers to form or create a 2- or 3-dimensional die stacking associated with at least one of MP wafer or finished parts clients for fabricating the another form of finished MP wafers or finished parts. That 2- or 3-dimensional die stacking MP wafer service or process can provide better functional integration and low cost manufacturing solution by linking heterogeneous semiconductor technologies or mix-mode (Digital, RF or Analog modes) IC designs via the simple linking process of wire bonding, interconnect bumping or through-silicon-via (TSV). In some embodiments, the semiconductor MP wafer process can be further followed up with a combination of post-wafer-fab processes; comprising cutting the MP wafer into pieces of discrete chips or modules, packaging, assembling, delivering or selling to a plurality of clients associated with the finished parts of the MP wafer.

Alternatively, a semiconductor MP wafer process can be achieved by processing the wafer zone-1 with a first IC design layout or exposure pattern, and processing the wafer zone-2 with a second IC design layout or exposure pattern, wherein the first and the second IC design layout or exposure patterns correspond to two different IC devices. Then, the MP wafer is processed with a subsequent process, including etching, deposition or ion-implantation, and the remaining processes for fabricating the finished MP wafer or finished parts. To lower down R&D prototype or production costs, two different IC devices or products can correspond to the same or different clients to meet specific time-to-market or production mix-volume requirements.

FIGS. 3A to 3D illustrate semiconductor MP wafers having various wafer zones fabricated by another embodiment of a semiconductor MP wafer process of the invention. As shown in FIGS. 3A to 3D, in one embodiment, the wafer zones 150 and 160 of the semiconductor MP wafers 100 may have regular or irregular shapes comprising a check-board shape, a stripe shape, a sector shape, fan shape or the like; especially the embodiment is the better prototyping or manufacturing solutions for 8 inches, 12 inches, 18 inches or larger diameter MP wafers.

Figure 4:
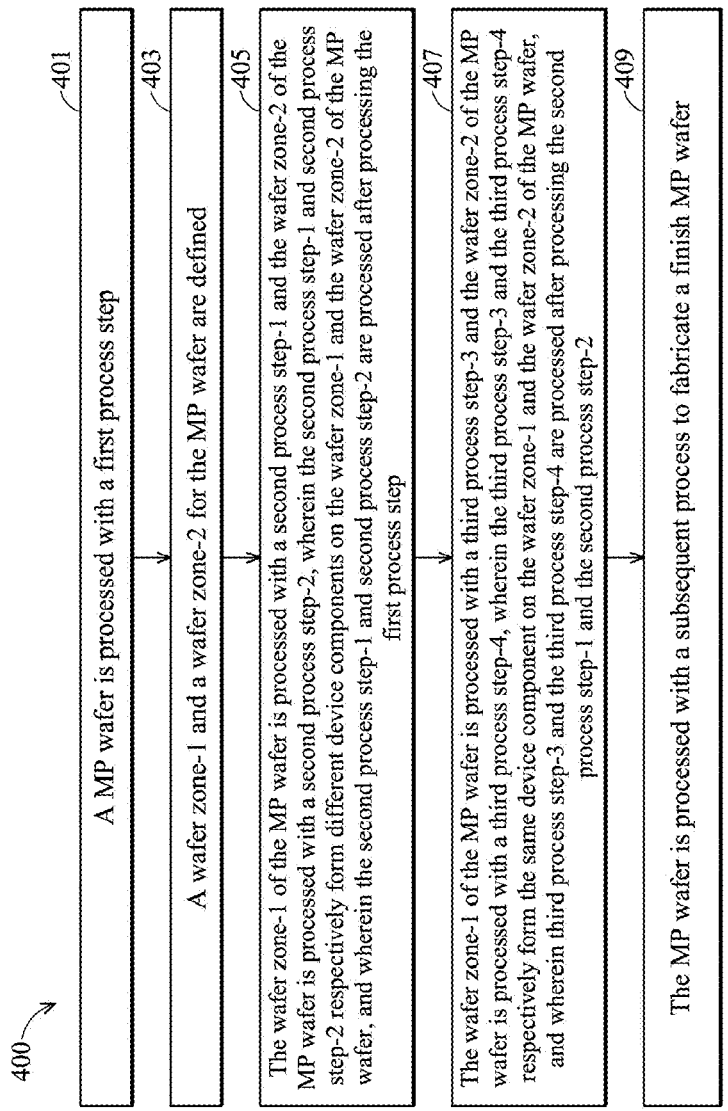
FIG. 4 illustrates a flow chart of another embodiment of a semiconductor MP wafer process of the invention.

FIG. 4 illustrates a flow chart of another embodiment of a semiconductor MP wafer process 400 of the invention. Firstly, an MP wafer is processed with a first process step (step 401). In one embodiment, the first process flow or step (step 401) comprising a lithography exposure process, an ion implantation process, a cleaning process or an etching process.

Figure 5:
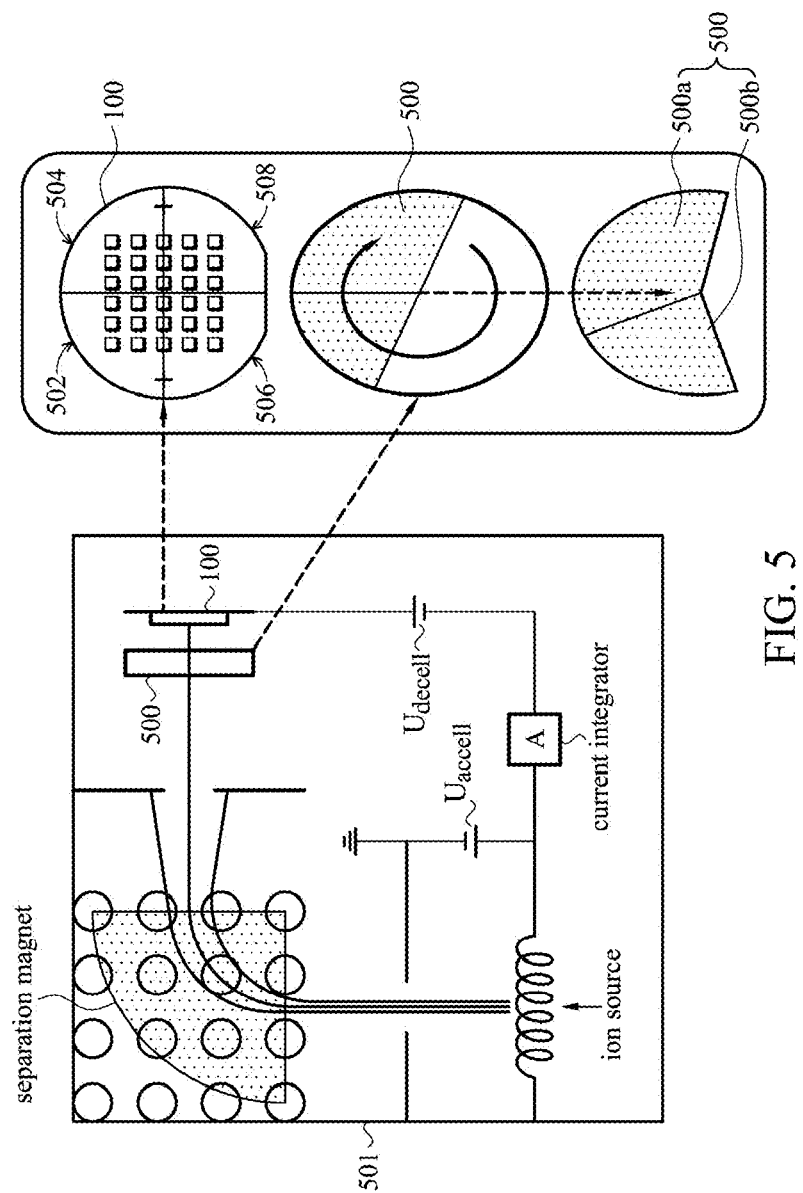
FIG. 5 illustrates one embodiment of a shutter means built in the ion-implantation equipment of the invention.

Next, a wafer zone-1 and a wafer zone-2 for the MP wafer are defined (step 403) where in the area of zone-1 and zone-2 can be about the same in size or can be different in size for various embodiments. In one embodiment, the size of the wafer zone-1 or the wafer zone-2 of the MP wafer may be about a quadrant or more of the MP wafer, and the zone-1 and the zone-2 of the MP wafer may be defined by a process associated with a mask, a shutter or a maskless process. In one embodiment, the zone-1 and the zone-2 of the MP wafer may be projected by a shutter means built in a semiconductor apparatus comprising lithography, etching or ion-implantation equipments. FIG. 5 illustrates one embodiment of a shutter means 500 built in the ion-implantation equipment 501 to define various wafer zones (such as wafer zones 502, 504, 506 and 508) of a semiconductor MP wafer 100 of the invention.

In one embodiment as shown in FIG. 5, the shutter means 500 may comprise at least two or more pieces of shutters (such as shutters 500a and 500b) to change the blocking area by at least one of a mechanical, electrical, optical or magnetic switching method, thereby defining zone-1 502 to zone-4 508 of the MP wafer 100.

Next, the wafer zone-1 of the MP wafer is processed with a second process step-1. Either sequentially or at the same time period along with forming the second process step-1, the wafer zone-2 of the MP wafer is processed with a second process step-2, wherein the second process step-1 and the second process step-2, respectively, forming different characteristic semiconductor device components on the wafer zone-1 and the wafer zone-2 of the MP wafer, and wherein the second process step-1 and the second process step-2 are processed after the first process step is completed (step 401). In one embodiment, the second process step-1 and the second process step-2 both correspond to a substantially same technology generation (technology node) or can be associated with different technology generations. In one embodiment, the second process step-1 and the second process step-2 comprising a lithography exposure process, an ion implantation process, a cleaning process or an etching process. The second process step-1 and step-2 may run through the substantially same or different fabrication tools (equipments) corresponding to a substantially same process flow, tool or step name, such as "interconnect formation", but they are associated with different process function or content (conditions or formation recipes) respectively.

In one embodiment, the second process step-1 may comprise a lithography exposure process with a first mask, such as the mask 4F, as shown in FIG. 1 the second process step-2 may comprise a lithography exposure process with a second mask such as the mask 4F' which is corresponding to the same masking level as of mask 4F, as shown in FIG. 1. In one embodiment, differences between the masks 4F and 4F' may comprise IC design or layout information comprising a device functional application, a chip size, design information, a layout information, an exposure pattern, a critical dimension or the like, wherein the IC design or layout information of the masks 4F and 4F' are both associated with a single MP wafer client. Alternatively, the applications and the IC chip sizes of the masks 4F and 4F' are substantially the same, and the design information, the exposure patterns and the critical dimensions of the masks 4F and 4F' are different. For example, the first 4F and the second 4F' masks may have different IC design or layout information comprising a semiconductor device source/drain layout pattern, an interconnection layout pattern or an via hole layout pattern. In this embodiment as shown in FIG. 1, the different masks 4F and 4F' correspond to the same masking level with different interconnections which correspond to the respective MP wafer group-1 and MP wafer group-2. Alternatively, if the second process step-1 and the second process step-2 are ion implantation processes, then its corresponding ion implantation energy, tilting or dosage recipes or conditions of the second process step-1 and the second process step-2 are different from that of each other. Alternatively, the second process step-1 and the second process step-2 are etching processes. For exemplary purposes, the semiconductor device gate etching processes, recipes or conditions of the etching processes may associate with different gate critical dimensions or gate cross-section profiles of the second process step-1 and the second process step-2, respectively. Therefore, the semiconductor device components fabricated by the second process step-1 and the second process step-2 may associate with different characteristic semiconductor device source/drain, an interconnection or a via hole.

Next, the wafer zone-1 of the MP wafer is processed with a third process step-3 and the wafer zone-2 of the MP wafer is processed with a third process step-4, wherein the third process step-3 and the third process step-4, respectively, may form substantially the same characteristic semiconductor device components on the wafer zone-1 and the wafer zone-2 of the MP wafer. After the second process step-1 and the second process step-2 are completed (step 405), the third process step-3 and the third process step-4 are processed by using substantially the same process, tools or steps (407) associated with substantially the same one or the same type of fabrication tools (equipments) which correspond to substantially the same process function or content (or recipe). In another exemplary case, the third process step-3 and the third process step-4, comprising a lithography exposure process, an ion implantation process, a cleaning process or an etching process, may share the substantially same process flow or steps, but run through the substantially same type fabrication tools (equipments) associated with the same or different tool suppliers.

Next, the MP wafer is processed with a subsequent process to fabricate a finished MP wafer or finished parts (step 409). In one embodiment, the subsequent process after step 409, comprising a lithography exposure process, an ion implantation process, a cleaning process or an etching process, may share the substantially same process flow or steps, but run through the same one or same type fabrication tools (equipments) associated with substantially the same process function or content (conditions or recipes). Finally, the finished MP wafer or finished parts is/are delivered to respective MP wafer or finished parts client. In another embodiment, the semiconductor MP wafer process 400 may further comprise a service or business process website linking to an internet online request or acknowledgment coming from an MP wafer or finished parts client for fabricating the MP wafer group-1 and the MP wafer group-2 with different processes. In addition, it can further comprises a service or linking process for MP wafers to create a 2- or 3-dimensional die stacking associated with at least one of MP wafer or finished parts clients for fabricating the another form of finished MP wafers with die stacking. That 2- or 3-dimensional die stacking MP wafer service or business process can provide better functional integration and low cost manufacturing solution by linking heterogeneous semiconductor process technologies or mix-mode (Digital, RF or Analog modes) IC designs via the simple linking process of wire bonding, interconnect bumping or through-silicon-via (TSV).

Ion-beam (comprising e-beam and other type of charged particle beams) maskless direct writing overcomes a few problems associated with masked or optical photolithography. Generally, it prevents us from small or deteriorated process windows, such as patterning resolution or DOF and the like, of conventional masked or optical photolithography process due to having shorter equivalent wavelengths. Also, it generally allows for better CD control, that otherwise would require very expensive optical masks employing complicated OPC, PSM or other optical correction methods and the like. Therefore, a semiconductor MP wafer process utilizing an ion-beam maskless lithography process has advantages of a shorter cycle time and being cost effective to overcome the requirements of IC prototyping fabrication, characterization or verification, including production manufacturing usage. Alternatively, the semiconductor MP wafer process utilizing an ion-beam maskless lithography process has an advantage of allowing fabrication of different IC devices via the same piece or same lot of semiconductor MP wafers. Now that the semiconductor MP wafer process, utilizing a set of optical masks incorporated with one or a few more ion-beam maskless lithography system, may fabricate one or more semiconductor IC devices (or products) corresponding to one or more first semiconductor IC devices and one or more second semiconductor IC devices. Each first semiconductor IC device relates to a first product design function having a first functional application field. Each second semiconductor IC device relates to second product design function or application which is different from that of the first one. The second function has a second application field differing from that of the first one. For instance, the second product application field can be a system memory to store the code or data of a computer system. On the other hand, the first product application can be a CPU or GPU to process system or graphic data computing, respectively.

Figure 6:
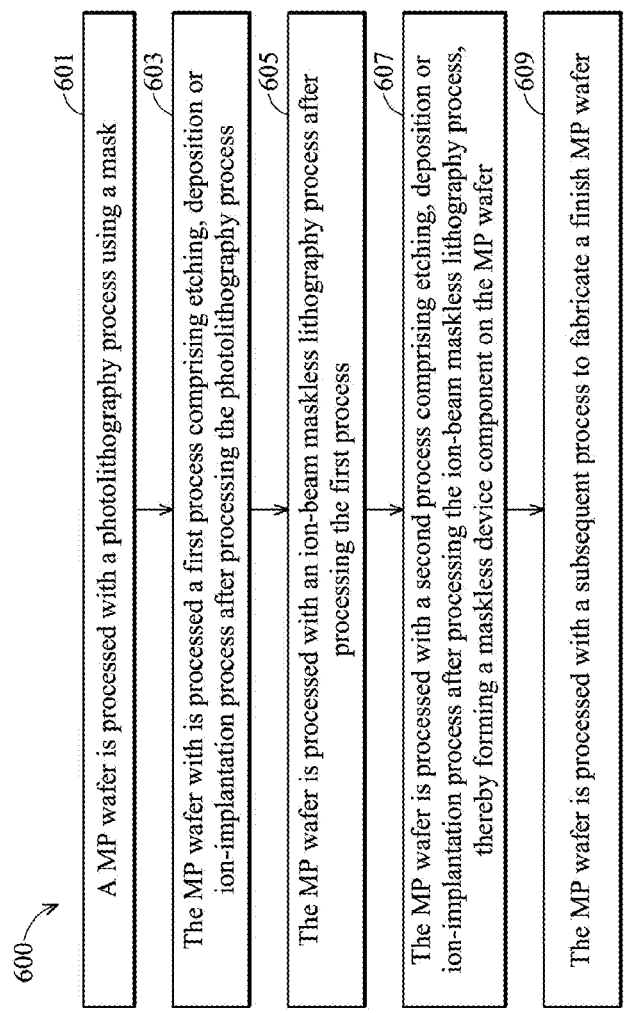
FIG. 6 illustrates a flow chart of yet another embodiment of a semiconductor MP wafer process of the invention.

FIG. 6 illustrates a flow chart of yet another embodiment of a semiconductor MP wafer process 600 of the invention. The semiconductor MP wafer process 600 utilizes an ion-beam maskless lithography process without requiring mask tooling time to fabricate a critical process or semiconductor device component such as a device source/drain, a gate, an interconnection or a via hole of a semiconductor device, thereby reducing mask making cycle-time, costs and improving fabrication yield rate. Firstly, an MP wafer is processed with a masked or optical photolithography process using a mask (step 601). Next, the MP wafer is processed with a first process (step 603) comprising an etching, a deposition or an ion-implantation process after the photolithography process is completed (step 601). It is noted that the first process may combine with other process steps and the first processes may not the next process step right after the lithography process.

Next, the MP wafer is processed with an ion-beam maskless lithography process (step 605). In one embodiment, the maskless lithography process is used to form a critical semiconductor process or device component comprising a device source/drain region, a gate, an interconnection or a via hole of a semiconductor device, wherein maskless lithography process is performed using maskless lithography equipment (tool) with an ion-beam energy of about less than 10 keV for reducing the secondary-ion beam interferences or blurring effects, during exposure step, and enhancing the ultimate fine line resolutions so as to achieve unexpected higher semiconductor device yield with much lower effective mass production cost. In one embodiment, the ion-beam maskless lithography process may further comprise defining a wafer zone-1 and a wafer zone-2 of the MP wafer. Next, a maskless exposure (or IC design) pattern-1 is formed on the wafer zone-1 of the MP wafer, and a maskless exposure (or IC design) pattern-2 is formed, sequentially or at the same time period along with forming the exposure pattern-1, on the wafer zone-2 of the MP wafer, wherein the maskless exposure pattern-1 and the maskless exposure pattern-2 are different. In one embodiment, the maskless exposure pattern-1 and the maskless exposure pattern-2 correspond to the substantially same generation of semiconductor device gate or interconnection critical dimensions for a single MP wafer client. Alternatively, the maskless exposure pattern-1 and the maskless exposure pattern-2 have different critical dimensions or profiles on semiconductor device gate or interconnection layers. In one embodiment, the maskless exposure pattern-1 and the maskless exposure pattern-2 correspond to, respectively, different MP wafer clients. In another embodiment, the MP wafer diameter is substantially about 8 inches, 12 inches or larger which can help with providing better flexibility for semiconductor WP wafer or finished parts production while minimizing NRE investment.

Next, the MP wafer is processed with a second process comprising an etching, a deposition or an ion-implantation process after the ion-beam maskless lithography process is completed, thereby forming a semiconductor device or process component on the MP wafer (step 607).

Next, the MP wafer is processed with a subsequent process to fabricate a finished MP wafer or finished parts (step 609). In one embodiment, the subsequent process comprising a lithography exposure process, an ion implantation process, a cleaning process or an etching process may share substantially the same one or the same type of fabrication tools (equipments) corresponding to the first process with different process function or content (or recipes) for saving the fabrication tool setup costs. Finally, the finished MP wafers or finished parts are delivered to a single or respective plurality of clients. In one embodiment, the semiconductor MP wafer process 600 may further comprise a service or business process website linking to an internet online request or acknowledgment coming from an MP wafer or finished parts client for fabricating the wafer zone-1 and wafer zone-2 of the MP wafer. In addition, as an exemplary case, it can further comprises a service or linking process for the MP wafer to create a 2- or 3-dimensional die stacking associated with at least one of clients for fabricating the another form of finished MP wafers with die stacking. That 2- or 3-dimensional die stacking MP wafer service or process can provide better functional integration and low cost manufacturing solution by linking heterogeneous semiconductor process technologies or mix-mode (Digital, RF or Analog modes) IC designs via the simple linking process of wire bonding, interconnect bumping or through-silicon-via (TSV).

Figure 7:
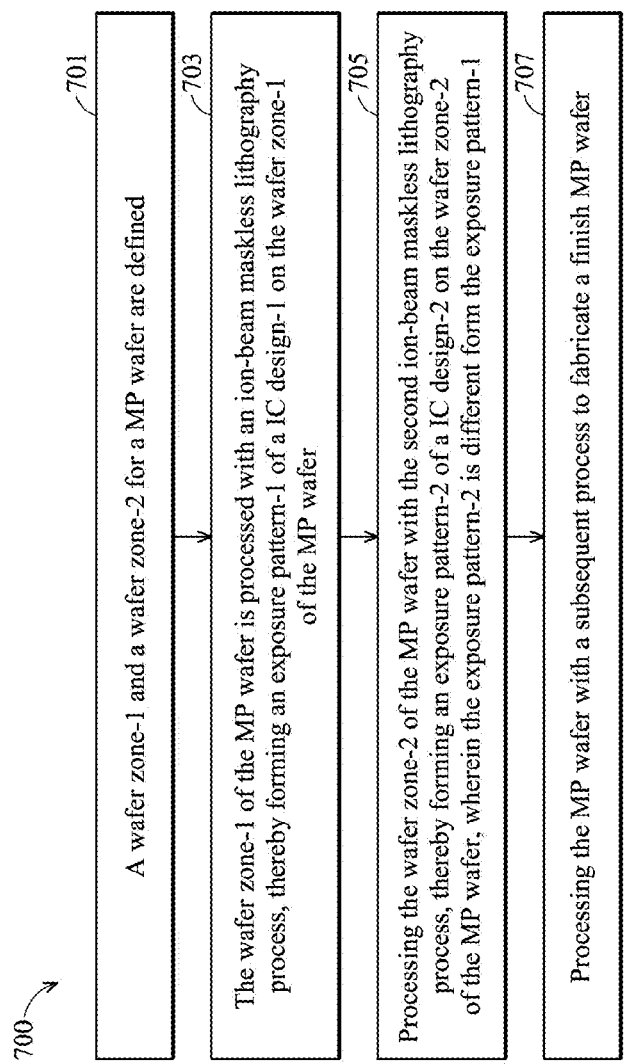
FIG. 7 illustrates a flow chart of still yet another embodiment of a semiconductor MP wafer process of the invention.
Figure 8:
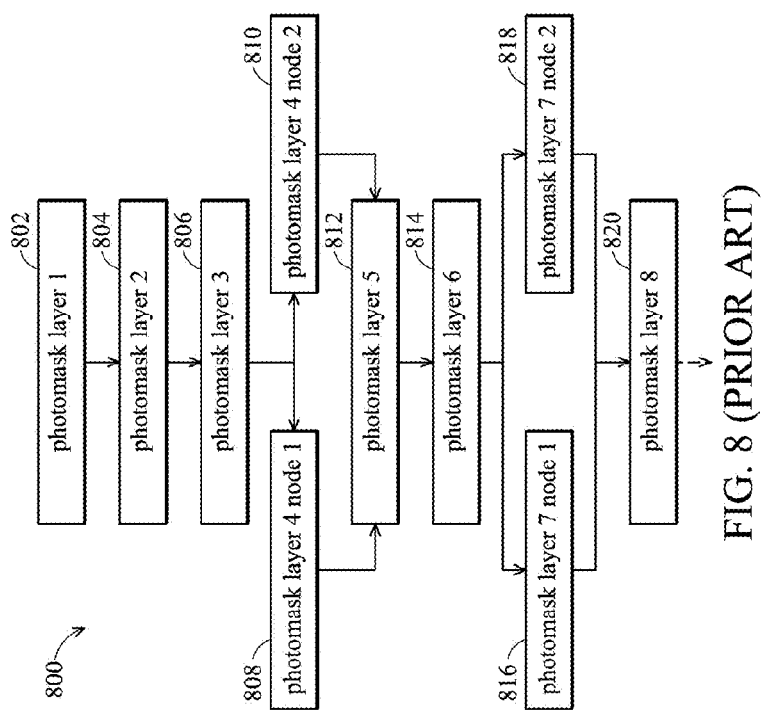
FIG. 8 illustrates a conventional multi-project wafer mask set incorporated with multiple process nodes.

Further, to save IC chip production costs for volume fabrication manufacturing or prototyping purposes as shown in FIG. 1 and FIG. 7, the MP wafer may be defined into various zones for forming various critical semiconductor process or device components, for example, a source/drain, a gate, an interconnection or a via hole of a semiconductor device, in the same lithography level using the ion-beam maskless lithography process. Therefore, finished IC chips or assembled finished parts in the respective wafer zones of the MP wafer can be delivered to respective clients. FIG. 7 illustrates a flow chart of still yet another embodiment of a semiconductor MP wafer process 700 of the invention. Firstly, a wafer zone-1 and a wafer zone-2 for an MP wafer are defined (step 701), where in the area of zone-1 and zone-2 can be about the same in size or can be different in size for various embodiments. In one embodiment, the zone-1 and the zone-2 of the MP wafer may be projected by a shutter means built in a semiconductor apparatus (tool) comprising lithography, etching or ion-implantation equipment.

Next, the wafer zone-1 of the MP wafer is processed with ion-beam maskless lithography process, thereby forming an exposure (or IC design) pattern-1 of an IC design-1 on the wafer zone-1 of the MP wafer (step 703). Next, either sequentially or at the same time period along with forming the exposure pattern-1, the wafer zone-2 of the MP wafer is processed with a second ion-beam maskless lithography process, thereby forming an exposure (or IC design) pattern-2 of an IC design-2 on the wafer zone-2 of the MP wafer, wherein the exposure pattern-2 is different from the exposure pattern-1 (step 705). In one embodiment, the ion-beam energy for the maskless lithography process may be about less than 10 keV. In one embodiment, IC chip sizes of the IC design-1 and the IC design-2 are different from that of each other.

Alternatively, IC chip sizes of the IC design-1 and the IC design-2 are substantially the same, wherein the exposure pattern-1 and the exposure pattern-2 are different from that of each other. In one embodiment, the IC design-1 and the IC design-2 may associate with the same or the different clients corresponding to MP wafer or finished parts. In one embodiment, the ion-beam maskless lithography equipment is a cluster tool with multiple exposure ion-beam columns including column-1 and column-2, wherein the column-1 exposes the exposure pattern-1 and, either sequentially or at the same time period along with forming the exposure pattern-1, column-2 exposes the exposure pattern-2, respectively.

Next, the MP wafer is processed with a subsequent process to fabricate a finished MP wafer (step 707). In one embodiment, the subsequent process comprises a lithography exposure process, an ion implantation process, a cleaning process or an etching process. Finally, the finished MP wafers or parts are delivered to respective clients. In one embodiment, the semiconductor MP wafer process 700 may further comprise a service or business process website linking to an internet online request or acknowledgment coming from at least one MP wafer client for fabricating the MP wafer zone-1 and the wafer zone-1 of the MP wafer with different IC designs, respectively. In addition, as an exemplary case, it can further comprises a service or linking process for the MP wafer to create a 2- or 3-dimensional die stacking associated with at least one of MP wafer clients for fabricating the another form of finished MP wafers with die stacking. That 2- or 3-dimensional die stacking MP wafer service or process can provide better functional integration and low cost manufacturing solution by linking heterogeneous semiconductor process technologies or mix-mode (Digital, RF or Analog modes) IC designs via the simple linking process of wire bonding, interconnect bumping or through-silicon-via (TSV).

Alternatively, the semiconductor MP wafer process 700 may further comprise processing the MP wafer with masked or optical photolithography equipment with a mask for a predetermined process layer, wherein a dimensional resolution of the photolithography equipment is larger than that of the ion-beam maskless lithography equipment, and wherein the predetermined process layer comprises a interconnection layer, an alignment-mark creation layer, a bond pad or a bumping RDL layer or the like.

Embodiments of a semiconductor MP wafer process are provided, wherein the semiconductor MP wafer process is specially designed to fabricate a semiconductor MP wafer having a diameter about 8 inches, 12 inches or larger. Embodiments of the semiconductor MP wafer process may not only enable clients to share NRE or manufacturing costs by producing a common MP wafer associating with their prototyping IC products, IP/Lib (macro) function units and designs, but also may reduce the number of total number of masking layers for prototyping cases. Further, embodiments of a semiconductor MP wafer process may reduce the number of physical masks or number of flattened design (or layout) information needed for maskless ion-beam lithography as to fabricate one or more desired semiconductor devices and lower the R&D prototyping or production NRE costs, wherein the two different IC devices or products can correspond to the same or different clients to meet their specific time-to-market or volume production requirements.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor MP wafer process, comprising:
   processing a plurality of MP wafers with a first process step;
   splitting a plurality of the MP wafers into an MP wafer group-1 and an MP wafer group-2 after the first process step is completed;
   processing at least one of the MP wafers of the MP wafer group-1 with a second process step-1 and processing at least one of the MP wafers of the MP wafer group-2 with a second process step-2, wherein the second process step-1 and the second process step-2, respectively, forming different characteristic semiconductor device components on the one MP wafer of the MP wafer group-1 and on the one MP wafer of the MP wafer group-2, and wherein the second process step-1 and the second process step-2 associated with substantially the same technology generation;
   processing the one of the MP wafers of the MP wafer group-1 with a third process step-3 and processing the one of the MP wafers of the MP wafer group-2 with a third process step-4 after the second process step-1 and the second process step-2 are completed respectively, wherein the third process step-3 and the third process step-4 form substantially the same characteristic device components on the one MP wafer of the MP wafer group-1 and the one MP wafer of the MP wafer group-2; and
   processing the one of the MP wafers of the MP wafer group-1 and the one of the MP wafers of the MP wafer group-2 with a subsequent process to fabricate finished MP wafers.

2. The semiconductor MP wafer process as claimed in claim 1, wherein a diameter of the plurality of MP wafers is substantially 12 inches or larger.

3. The semiconductor MP wafer process as claimed in claim 1, wherein the second process step-1 comprises a lithography exposure process with a first IC patterning information and the second process step-2 comprises a lithography exposure process with a second IC patterning information, and wherein the first and the second IC patterning information are different IC patterning information.

4. The semiconductor MP wafer process as claimed in claim 3, wherein the different IC patterning information comprises, a semiconductor device source/drain formation pattern, an interconnection formation pattern or a via hole formation pattern.

5. The semiconductor MP wafer process as claimed in claim 1, wherein the second process step-1 and the second process step-2 comprise ion implantation or etching processes with recipes or conditions which are different.

6. The semiconductor MP wafer process as claimed in claim 3, wherein the different IC patterning information of the lithography exposure process is associated with at least one of MP wafer clients.

7. The semiconductor MP wafer process as claimed in claim 5, wherein the etching processes are associated with gate formation processes.

8. The semiconductor MP wafer process as claimed in claim 1, further comprising a linking process for the MP wafers to form a 2- or 3-dimensional die stacking, wherein the linking process is characterized by a wire bonding process, an interconnect bumping process or a through-silicon-via (TSV) process.

9. The semiconductor MP wafer process as claimed in claim 1, further comprising a website service linking to an internet online request or acknowledgment.

10. The semiconductor MP wafer process as claimed in claim 1, wherein each of the finished MP wafers further comprise a plurality of IC designs with different chip sizes, wherein the finished MP wafer is diced by a dicing process comprising Laser.

11. A semiconductor MP wafer process, comprising:
processing an MP wafer with a photolithography process using a mask;
processing the MP wafer with a first process comprising an etching, a deposition or an ion-implantation process after the photolithography process is completed;
processing the MP wafer with an ion-beam maskless lithography process;
processing the MP wafer with a second process comprising an etching, a deposition or an ion-implantation processes which are associated with and after the ion-beam maskless lithography process; and
processing the MP wafer with a subsequent process to fabricate a finished MP wafer.

12. The semiconductor MP wafer process as claimed in claim 11, wherein processing the MP wafer with the ion-beam maskless lithography process further comprises:
defining a wafer zone-1 and a wafer zone-2 of the MP wafer;
forming a maskless exposure pattern-1 on the wafer zone-1 of the MP wafer; and
forming a maskless exposure pattern-2 on the wafer zone-2 of the MP wafer, wherein the maskless exposure pattern-1 and the maskless exposure pattern-2 are different.

13. The semiconductor MP wafer process as claimed in claim 11, wherein the maskless exposure pattern-1 and the maskless exposure pattern-2 are associated with the substantially same technology generation.

14. The semiconductor MP wafer process as claimed in claim 12, wherein the maskless exposure pattern-1 and the maskless exposure pattern-2 are associated with two or more of MP wafer clients.

15. The semiconductor MP wafer process as claimed in claim 11, wherein the ion-beam maskless lithography process is performed using maskless lithography equipment with ion-beam energy of about less than 10 keV.

16. The semiconductor MP wafer process as claimed in claim 11, further comprising a linking process for the MP wafer to form a 2- or 3-dimensional die stacking, wherein the linking process is characterized by a wire bonding process, an interconnect bumping process or a through-silicon-via (TSV) process.

17. The semiconductor MP wafer process as claimed in claim 11, further comprising a website service linking to an internet online request or acknowledgment.

18. The semiconductor MP wafer process as claimed in claim 11, wherein the finished MP wafer further comprises a plurality of IC designs with different chip sizes, wherein the finished MP wafer is diced by a dicing process comprising Laser.

19. A high yield semiconductor wafer dicing, scribe and chip separation process, comprising:
forming a plurality of IC designs with different chip sizes on a semiconductor wafer, wherein the plurality of IC designs respectively containing a lithography patterning information, metal interconnection pattern, inter-layer via hole pattern or chip dimension are different;
processing a first wafer scribe process comprising Laser on the wafer, wherein the Laser process removes an enough portion of surface material or layer on the scribe line area of the wafer; and
applying a subsequent process to the wafer, wherein the subsequent process at least comprises a die picking up process, and the die picking up process is used for separating individual dies of the plurality of IC designs out of the wafer having diced.

20. The high yield semiconductor wafer dicing and chip separation process as claimed in claim 19, wherein the subsequent process further comprises a back-grind process to further thinning down the wafer on a backside of the wafer.

21. The high yield semiconductor wafer dicing and chip separation process as claimed in claim 19, wherein before the first wafer scribe process, there is a back-grind process is used to removing a major portion of material or semiconductor layer of the wafer on a backside of the wafer.

22. The high yield semiconductor wafer dicing and chip separation process as claimed in claim 21, wherein the back-grind process comprises a chemical mechanical polish process.

* * * * *